United States Patent [19]

Takenaka

[11] Patent Number: 5,248,871
[45] Date of Patent: Sep. 28, 1993

[54] AUTOMATIC GAIN CONTROL CIRCUIT

[75] Inventor: Shinya Takenaka, Osaka, Japan

[73] Assignee: Sumitomo Electric Industries, Ltd., Osaka, Japan

[21] Appl. No.: 719,173

[22] Filed: Jun. 21, 1991

[30] Foreign Application Priority Data

Jun. 21, 1990 [JP] Japan .................... 2-163578
Jun. 21, 1990 [JP] Japan .................... 2-163579

[51] Int. Cl.⁵ .................................. G06K 7/10
[52] U.S. Cl. ............................ 235/462; 235/463; 235/470
[58] Field of Search ............... 235/462, 463, 470, 454

[56] References Cited

U.S. PATENT DOCUMENTS 3,949,233 4/1976 Gluck .................. 235/462
4,528,444 7/1985 Hara et al. .

FOREIGN PATENT DOCUMENTS 52-45222 4/1977 Japan .
56-131258 10/1981 Japan .
63-63958 12/1988 Japan .

Primary Examiner—Harold Pitts
Attorney, Agent, or Firm—Cushman, Darby & Cushman

[57] ABSTRACT

An automatic gain control (AGC) circuit for use in an optical code reader which eliminates error caused when regular reflecting light is directly incident on the detector element of the optical code reader. The AGC has a variable gain amplifier which receives a signal from the detection element and outputs a signal to a peak-holding circuit. The output from the peak-holding circuit is used to control the gain of the variable gain amplifier. A reset circuit resets the output of the peak-holding circuit either when the output reaches a predetermined level, or at regular intervals during the operation of the optical code reader. The output of the variable gain amplifier is fed to a binary circuit.

21 Claims, 5 Drawing Sheets

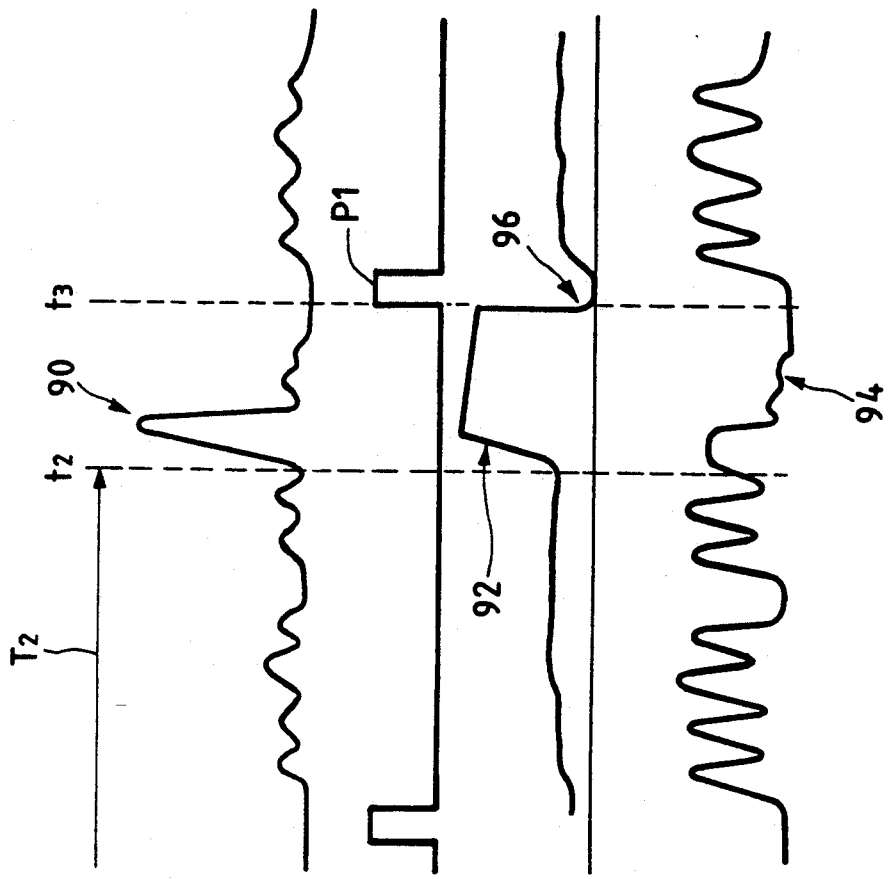

AUTOMATIC GAIN CONTROL CIRCUIT

BACKGROUND OF THE INVENTION

1. Field of the Invention

The present invention relates to an automatic gain control circuit for use in an optical code reader for optically reading bar codes or characters.

2. Description of Related Arts

Optical code readers such as bar code readers and optical character readers (OCRs), are widely used to read a variety of codes and symbols through an optical system to be input into computers. There are two types of optical code readers, the laser type scanner and the CCD (Charge Coupled Device) type scanner. The laser type scanners scan a surface for bar codes or characters by using a laser beam and detecting the light reflected from the scanned surface. The CCD type scanners employ an image sensor on the surface of which the optical images are formed by the light reflected from the code surface, and the optical images are scanned electronically.

With such an optical code reader as usually carried by the hand of an operator, in order to ensure that variations in the reading distance between the code display surface and the optical code reader, and resulting variations in the quantity of light reflected by the code display surface, do not degrade the accuracy of the optical code reader, an automatic gain control (AGC) circuit is used. The AGC circuit includes a variable gain amplifier circuit which converts the output of a detection element, such as a photodiode or an image sensor, into a signal with a predetermined amplitude.

FIG. 1 is a block diagram of a general AGC circuit arrangement. A detection element generates an electric signal corresponding to the quantity of light reflected from a code display surface. This signal is input to a variable gain amplifier circuit 10. The output of the variable gain amplifier circuit 10 is supplied to a binary circuit (not shown) which converts the output into a value of [1] or [0] based on a suitable slice level. The output signal of the variable gain amplifier circuit 10 is also fed back to the variable gain amplifier circuit 10 through a peak-holding circuit 12 to control the gain of the variable gain amplifier circuit 10.

The output of the peak-holding circuit 12 quickly increases as the output of the variable gain amplifier 10 increases, whereas when the output of the variable gain amplifier decreases, the output of the peak-holding circuit 12 decreases slowly according to a relatively large time constant. This stabilizes the circuit operation from the turbulent variations of the input signal.

FIG. 2 is a schematic diagram of a variable gain amplifier circuit 10. The variable gain amplifier circuit 10 includes an operational amplifier 14. The inverting input terminal of the operational amplifier 14 receives the output signal from the detection element via a resistor 16. The output signal of the operational amplifier 14 is fed back to the inverting terminal via a field effect transistor 18. The control signal from the peak-holding circuit 12 is input to the gate of the transistor 18. With this arrangement, a reverse-bias voltage is applied between the gate and the source of the transistor 18 creating a variable electric resistance between the drain and the source of the transistor 18 which varies with the gate potential. The gain of the amplifier circuit 10 is thus controlled by the peak-holding circuit 12 which sets the drain to source resistance of the transistor 18.

A large quantity of reflected light causes the output signal of the detection element to increase which causes the gain of the variable gain amplifier circuit 10 to decrease, whereas a small quantity of reflected light causes the output signal of the detection element to decrease which causes the gain of the variable gain amplifier circuit 10 to increase. As a result, the output of the variable gain amplifier circuit 10 remains substantially constant, irrespective of the quantity of light thus reflected from the code display surface. Therefore, variations in the quantity of light received by the detection element, caused by variations in the reading distance, do not degrade the accuracy of the optical code reader.

FIG. 3 is a waveform diagram showing how the circuits of FIGS. 1 and 2 process a signal. FIG. 3(a) shows the input to the variable gain amplifier circuit 10; FIG. 3(b) shows the output from the peak-holding circuit 12; and FIG. 3(c) shows the output from the AGC circuit.

The output signal of the peak-holding circuit 12 follows the variations of the input signal with a period T. As the gain of the variable gain amplifier circuit 10 varies in proportion to the input signal level, the output signal of the variable gain amplifier circuit 10 oscillates corresponding to a code with a substantially constant amplitude as shown in FIG. 3(c).

It is impossible for a conventional optical code reader, as described above, to function when the laser beam is incident on the code display surface in a direction substantially opposite to the reflected light. In this case, the regular reflection light, which is of substantially greater intensity than scattered reflected light, is directly incident on the detection element. The regular reflection light has an intensity from tens to hundreds of times greater than that of the scattered reflected light and consequently the input signal from the detection element to the variable gain amplifier circuit 10 indicates a great peak as shown by the reference number 20.

When a great peak occurs in the input signal from the detection element, the output of the peak-holding circuit 12 sharply rises as shown by the reference number 22 and consequently the gain of the variable gain amplifier circuit 10 becomes extremely small. Because the peak-holding circuit 12 has a relatively large time constant, the output signal from the peak-holding circuit 12 is kept at a large value even after the output signal of the detection element has decreased and the gain of the variable gain amplifier circuit 10 remains extremely small. Therefore, the amplitude of the output from the variable gain amplifier circuit 10 decreases as shown by the reference numeral 24 in FIG. 3(c) and it is impossible for the optical code reader to properly read bar codes or optical characters.

To fix this problem, it may be possible to supply the output of the detection element to the variable gain amplifier circuit 10 via a limiter circuit. However, because the output of the detection element drastically varies with the variation in the quantity of light received, this could increase reading error by the optical code reader by simply cutting off the input signal at a given level.

SUMMARY OF THE INVENTION

It is an object of the present invention to eliminate any read error created after regular reflected light is directly incident on the detection element in an optical code reader.

In order to attain the above recited object of the invention, among others, the present invention comprises a variable gain amplifier circuit for receiving the output signal from the detection element, a peak-holding circuit which detects and holds the peak level of the output signal of the variable gain amplifier circuit and feeds it back to control the gain of the variable gain amplifier circuit so that the amplitude of the output signal of the variable gain amplifier circuit is kept substantially constant, and a reset circuit, used for resetting the peak level in the peak-holding circuit, which either resets the peak level when the peak level exceeds a preset reference value or resets the peak value by means of a reset signal generated a predetermined number of times, preferably once, every code reading operation.

BRIEF DESCRIPTION OF THE DRAWINGS

These and other advantages of the present will become more clear upon consideration of the following detailed description of the preferred embodiment together with the drawings in which:

FIGS. 7(a), 7b, 7c, 7d waveform diagrams showing how the circuit of FIG. 6 processes a signal.

DETAILED DESCRIPTION OF THE PREFERRED EMBODIMENT

Figure 1:
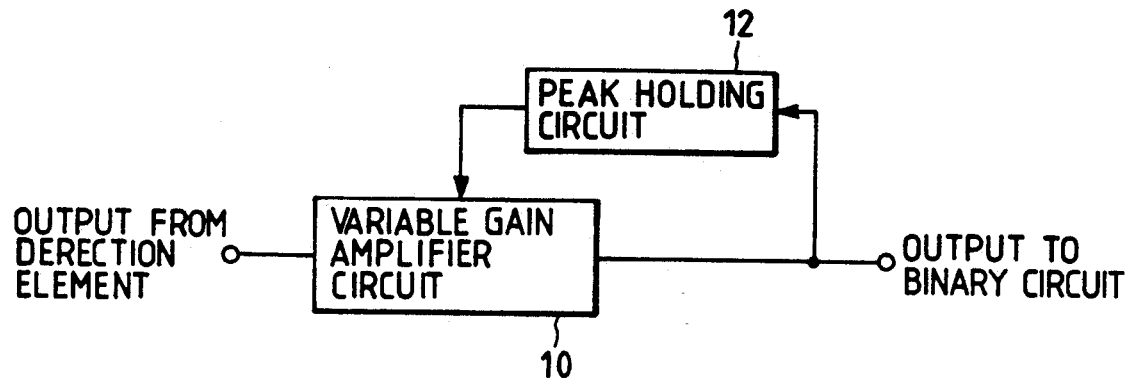
FIG. 1 is a block diagram of an optical code reader.
Figure 2:
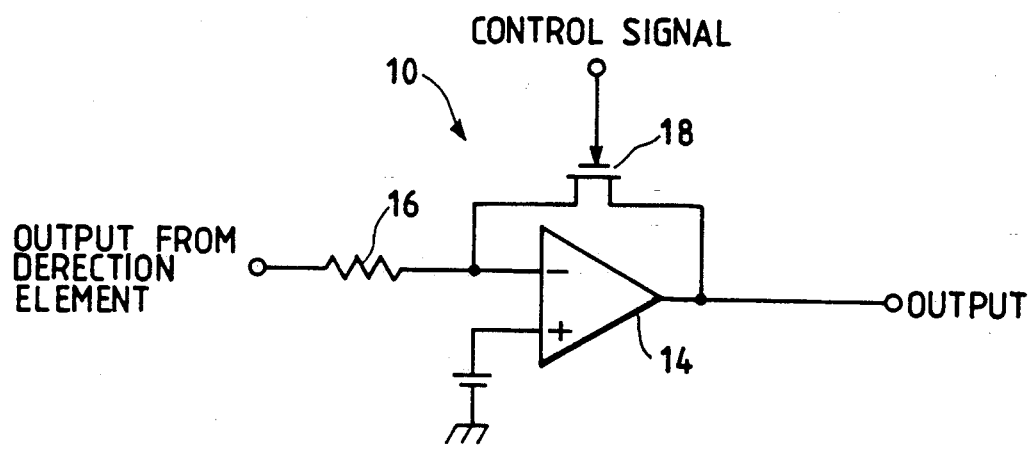
FIG. 2 is a schematic diagram of a variable gain amplifier circuit.
Figure 3:
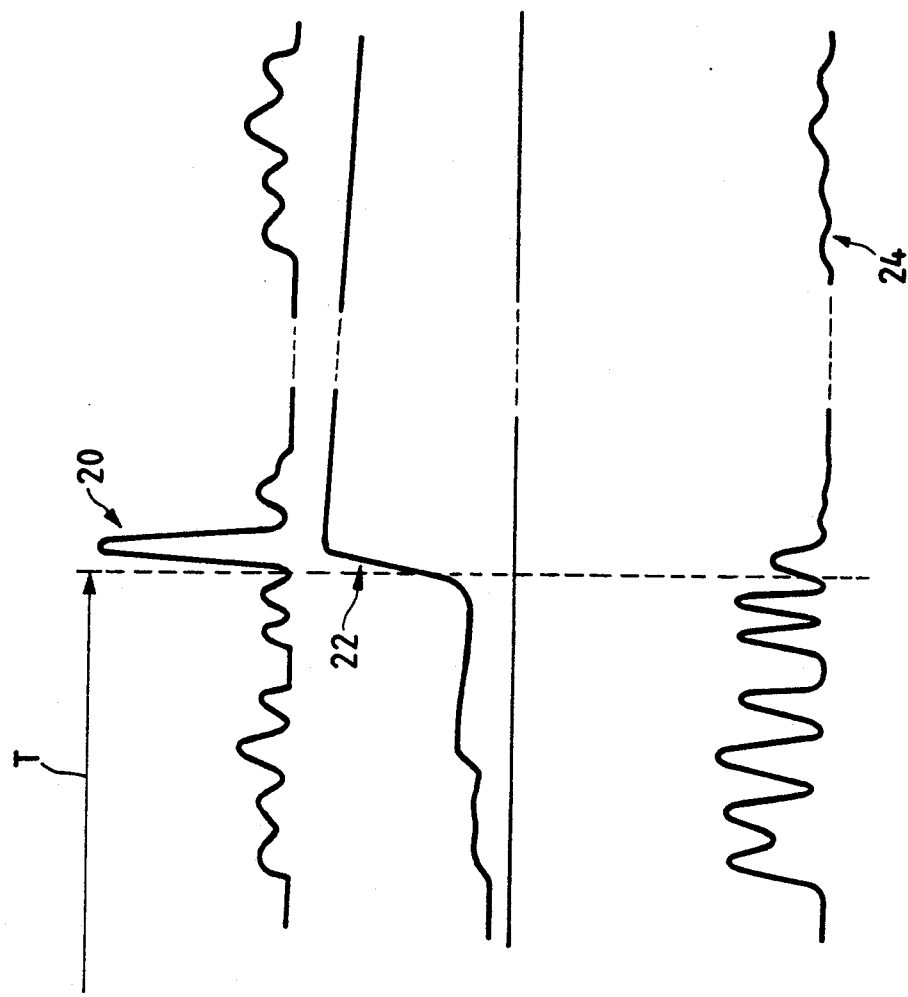
FIGS. 3(a), 3(b) and 3(c) waveform diagrams showing how the circuits of FIGS. 1 and 2 process a signal.
Figure 4:
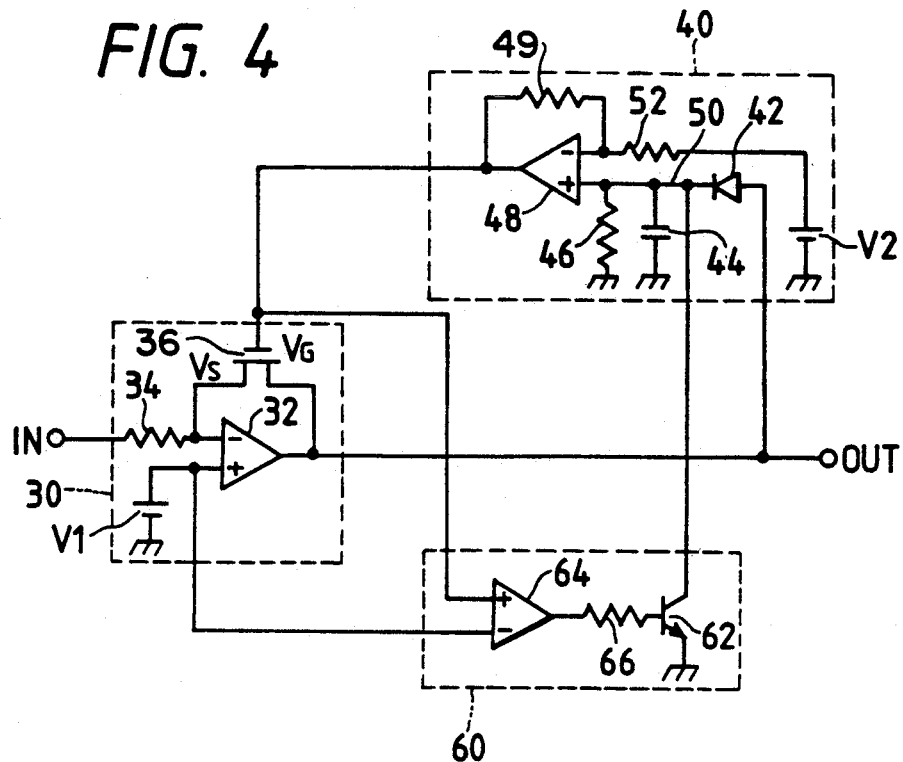
FIG. 4 is a schematic diagram of a first embodiment of the present invention.

FIG. 4 is a schematic diagram of a first embodiment of an automatic gain control (AGC) circuit according to the present invention. The AGC circuit is used in an optical code reader which illuminates the surfaces on which bar codes or characters are formed and detects the reflected light. The output signal of a detection element (not shown), such as a photodiode or a CCD image sensor, is applied to the input terminal IN of a variable gain amplifier circuit 30. The output signal of the variable gain amplifier circuit 30 is applied from the output terminal OUT to a binary circuit (not shown) and the output is converted to a binary signal of [1]or [0].

The output signal of the variable gain amplifier circuit 30 is also applied to a peak-holding circuit 40 and the output signal of the peak-holding circuit 40 is applied to the variable gain amplifier circuit 30 as a control signal for controlling the gain of the variable gain amplifier circuit 30. The peak-holding circuit 40 is reset by a reset circuit 60.

The variable gain amplifier circuit 30 has an operational amplifier 32. A signal from the detection element is applied via a resistor 34 to the inverting input terminal of the operational amplifier 32, and a reference voltage $V1$ is applied to the noninverting input terminal of the operational amplifier 32. The output of the variable gain amplifier circuit 30 is fed back via an N-channel field effect transistor 36 to the inverting input terminal. The control signal output from the peak-holding circuit 40 is applied to the gate of the transistor 36 to create a variable electric resistance between the source and drain of the transistor 36 which varies with the gate potential. Thereby, the gain of the variable gain amplifier circuit 30 varies with the source to drain resistance of the transistor 36. For the transistor 36 to function as a variable resistor, a reverse-bias voltage has to be applied between the gate and the source such that the gate voltage $VG$ is less than the source voltage $VS$ ($V=V1$).

The peak-holding circuit 40 comprises a capacitor 44 which is charged quickly by the current from the variable gain amplifier circuit 30 via a diode 42, and which slowly discharges through a resistor 46 due to a relatively large time constant (e.g., the time required for scanning once with a laser beam). The voltage across the capacitor 44 is subjected to positive-phase amplification by an operational amplifier 48 having a resistor 49 coupled between the inverting input terminal and output terminal thereof, before being applied to the gate of the transistor 36. Because a reference voltage $V2$ is applied via a resistor 52 to the inverting input terminal of the operational amplifier 48, the output signal of the operational amplifier 48, the control signal for the transistor 36, is rendered lower than the source voltage $VS$ ($=V1$) as required for the drain to source of the transistor 36 to operate as a variable resistor.

In a first embodiment of the present invention, the collector of an NPN transistor 62 of a reset circuit 60 is connected to a line 50 to which the diode 42, the operational amplifier 48 and the capacitor 44 are connected. The NPN transistor 62 is caused to conduct/break by the output of a comparator 64 which compares the gate voltage $VG$ of the transistor 36 in the variable gain amplifier circuit 30 with the reference voltage $V1$ given to the noninverting input of the operational amplifier 32. Because the voltages of the two terminals of the operational amplifier 32 are equal, the source voltage $VS$ of the transistor 36 is equal to the reference voltage $V1$. Therefore, the comparator 64 compares the gate voltage $VG$ with the source voltage $VS$.

The comparator 64 supplies current via a resistor 66 to the base of the NPN transistor 62 when the gate voltage $VG$ is higher than the reference voltage $V1$, thus holding the NPN transistor 62 in conduction. Because this grounds the line 50, the capacitor 44 is quickly discharged and the peak level in the peak-holding circuit 40 is reset. Therefore, the reset circuit 60 resets the peak level when the control signal becomes higher than the reference voltage $V1$.

The peak-holding circuit is reset when the gate voltage $VG$ of the transistor 36 becomes higher than the source voltage $VS$ ($=V1$) in this embodiment because the transistor 36 is no longer able to function as a variable resistor because the gate to source of the transistor 36 is forward biased.

Figures 5A, 5B, 5C:
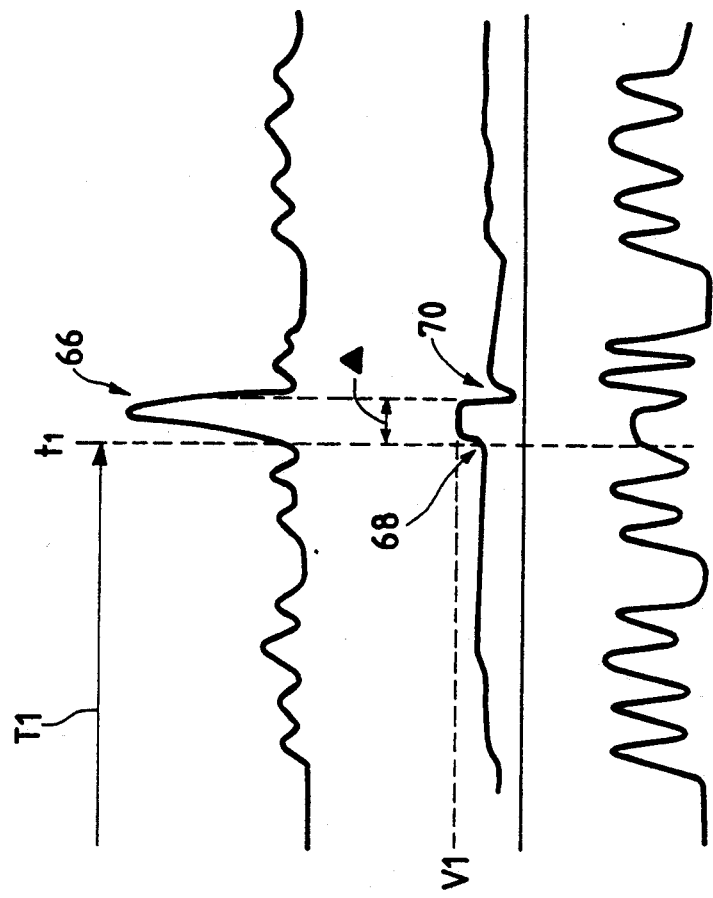
FIGS. 5(a), 5b and 5(c) waveform diagrams showing how the circuit of FIG. 4 processes a signal.

FIG. 5 is a waveform diagram showing how the circuit of FIG. 4 processes a signal. FIG. 5(a) shows the input to the variable gain amplifier 30; FIG. 5(b) shows the output of the peak-holding circuit 40 which is applied to the transistor 36 of the variable gain amplifier circuit 30; and FIG. 5(c) shows the output signal from AGC circuit.

As the output signal of the peak-holding circuit 40 varies with the input signal over a period T1, the gain of the variable gain amplifier circuit 30 varies with the level of the control signal from the peak-holding circuit 40. The resulting output signal at the OUT terminal oscillates with a predetermined amplitude. The binary circuit connected to the OUT terminal changes the signal into a binary signal by using a predetermined slice level.

When the laser is directed at the code display surface in a direction substantially opposite to the reflected light during a period starting with t1, the detection element receives the regular reflected light causing a peak in the input to the variable gain amplifier circuit 30 as shown by the reference number 66 in FIG. 5(a). Consequently, the capacitor 44 in the peak-holding circuit 40 instantly charges and the control signal output of the peak-holding circuit 40 quickly rises as shown by the reference number 68 in FIG. 5(b).

When the control signal from the peak-holding circuit 40 reaches the reference voltage V1, the output of the comparator 32 is inverted from the low to the high level causing the transistor 62 to conduct thereby discharging the capacitor 44 to reset the peak-holding circuit 40 over a period ▲. As shown by a reference character 70, the control signal also falls when the output signal of the detection element falls and thereby the transistor 62 is interrupted, whereas the peak-holding circuit 40 is restored out of the reset state. In a period following the period ▲, the control signal from the peak-holding circuit 40 again varies with the output of the detection element. The output of the variable gain amplifier circuit 30 again oscillates with a constant amplitude. Therefore when the detection element detects regular reflected light, the peak level in the peak-holding circuit 40 is reset to allow the optical code reader to continuously and smoothly read codes.

The first embodiment of the present invention is not limited to the above description. Although the N-channel field effect transistor 36 is used in the variable gain amplifier circuit 30 in this first embodiment, a P-channel field effect transistor may readily be used. However, it will be needed to invert the polarity of the control signal from the peak-holding circuit 40. Additionally, although the reset circuit 60 includes the comparator 64 and the transistor 62, the transistor 62 is unnecessary if an open collector output comparator is used. However, the two inputs to the comparator should be interchanged. Finally, although the peak hold level is reset when the control signal output from the peak-holding circuit 40 exceeds the reference voltage V1, the source voltage VS of the transistor 36 in the first embodiment, the reference voltage for the reset circuit 6 may be different from the source voltage of the transistor 36.

Figure 6:
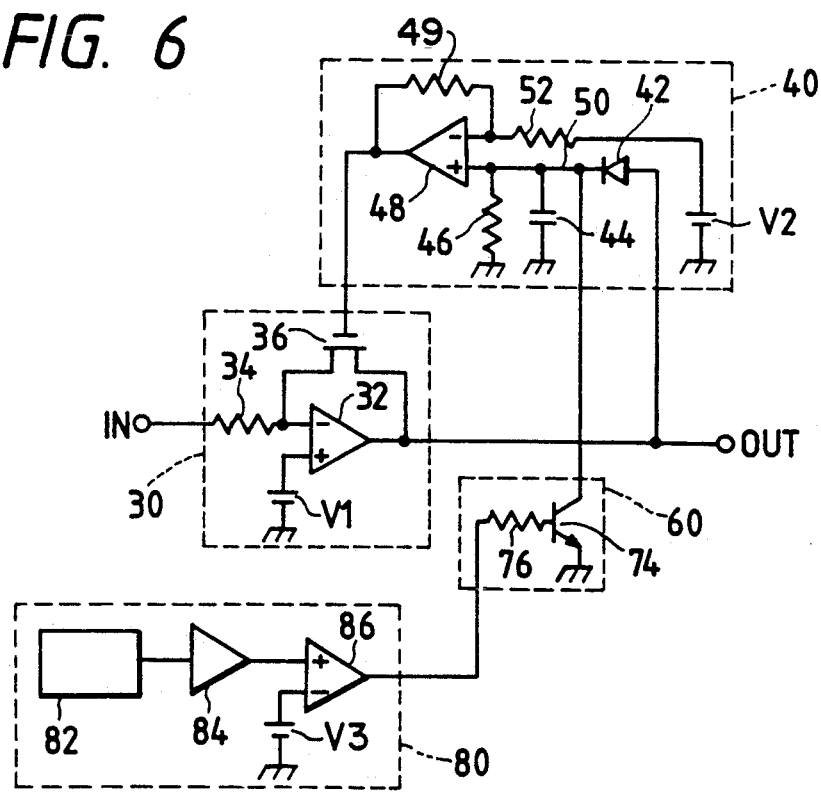
FIG. 6 is a schematic diagram of a second embodiment of the present invention.

FIG. 6 is a schematic diagram of a second embodiment of the present invention. Like elements that function similarly to those in the first embodiment, as shown in FIG. 4, have like reference numerals. In this embodiment, the reset circuit 60 is connected to the peak-holding circuit 40 to reset the peak level. The output of a synchronizing signal generator circuit 80, which generates a synchronizing signal in response to the commencement of a scanning cycle, is supplied to the reset circuit 60. The peak level in the peak-holding circuit 40 is reset in response to the synchronizing signal.

The collector of an NPN transistor 74 of the reset circuit 60 is connected to the line 50 to which the diode 42, the operational amplifier 48 and the capacitor 44 are connected. The NPN transistor 74 conducts in response to the synchronizing signal from the synchronizing signal generator circuit 80 and causes the capacitor 44 to quickly discharge by grounding the line 50.

The synchronizing signal generator circuit 80 has a detector 82 which detects the start of a scanning operation by the laser type scanner. The detector 82 can be an optical detector provided in a casing near one end of a window through which the laser beam is emitted in a so-called hand-held type bar code reader.

The output signal of the detector 82 is amplified by an amplifier 84 and is input to a comparator 86. The comparator 86 compares the output signal of the amplifier 84 and a reference voltage V3 and introduces a detection pulse corresponding to the start of a scanning operation. The detection pulse is input to the transistor 74 of the reset circuit 60 via a resistor 76 as the synchronizing signal.

FIG. 7 illustrates how the circuit of FIG. 6 processes a signal. FIG. 7(a) shows the output signal of the detection element which is input to the IN terminal; FIG. 7(b) shows the synchronizing signal output from the synchronizing signal generator circuit 80; FIG. 7(c) shows the control signal output from the peak-holding circuit 40; and FIG. 7(d) shows the output from the AGC circuit.

As described above with reference to the first embodiment, when the laser is directed at the code display surface in a direction substantially opposite to the reflected light during a period starting with t1, the detection element receives the regular reflected light causing a peak in the input to the variable gain amplifier circuit 30 as shown by the reference number 90 in FIG. 7(a). The capacitor 44 in the peak-holding circuit 40 instantly charges and the control signal output of the peak-holding circuit 40 quickly rises as shown by the reference number 92 in FIG. 7(c). The gain of the variable gain amplifier circuit 30 thereby becomes extremely small and the output of the AGC circuit appears to be ruined as shown by the reference number 94 of FIG. 7(d).

The detection pulse P1 applied by the synchronizing signal generator circuit 80 at time t3 causes the reset circuit 60 reset the peak level in the peak-holding circuit 40 as shown by the reference number 96, so that the control signal from the peak-holding circuit 40 again varies with the output of the detection element. After the detection pulse P1 is applied to the reset circuit 60, the optical code reader can accurately read codes again. Because the synchronizing signal generator circuit 80 outputs a detection pulse each time that scanning is commenced, the optical code reader can accurately read codes during a period of scanning directly following a period in which the detection element receives regular reflection light from the code display surface.

The second embodiment of the present invention is not limited to the preceding description. Although the synchronizing signal generator circuit 80 generates a synchronizing signal at the start of a scanning operation of a laser type scanner, the synchronizing signal may be generated at the start of a scanning operation in a CCD type scanner. Moreover, the synchronizing signal may be generated in response to the termination of scanning. Additionally, although the peak level is reset each time scanning operation, the peak level may be reset once every two or more scanning operations.

What is claimed is:

1. An automatic gain control circuit for use in an optical code reader, comprising:
   a variable gain amplifier circuit for receiving an input signal from a detection element of said optical code reader and outputting an output signal in accordance therewith, said variable gain amplifier circuit comprising an amplifier and a variable impedance element coupled between an input and output of said amplifier to feed said output signal back to said input thereof;

a peak-holding circuit for receiving said output signal provided by said variable gain amplifier circuit and providing a control signal to said variable impedance element to control said variable impedance element in accordance with said output signal to control a gain of said variable gain amplifier circuit; and a reset circuit for resetting said peak-holding circuit.

2. An automatic gain control circuit according to claim 1, wherein said reset circuit resets said peak-holding circuit when said control signal exceeds a predetermined value.

3. An automatic gain control circuit according to claim 2, wherein said predetermined value is equal to a reference voltage supplied to said variable gain amplifier circuit.

4. An automatic gain control circuit according to claim 2, wherein said variable gain amplifier circuit comprises:

a resistor coupled to an inverting input of said amplifier and said detection element to receive said input signal from said detection element; and a reference voltage source coupled to a noninverting terminal of said amplifier; and wherein:

said variable impedance element comprises a transistor having a source coupled to said inverting input of said amplifier, a drain coupled to an output terminal of said amplifier and a gate coupled to said peak-holding circuit to receive said control signal from said peak-holding circuit.

5. An automatic gain control circuit according to claim 4, wherein said field effect transistor is an N-channel device.

6. An automatic gain control circuit according to claim 4, wherein said field effect transistor is a P-channel device.

7. An automatic gain control circuit according to claim 2, wherein said peak-holding circuit comprises:

a diode for receiving said output signal of said variable gain amplifier circuit;

a capacitor coupled between said diode and ground;

a first resistor coupled between said diode and ground;

a reference voltage source;

second and third resistors; and a second amplifier having a noninverting input coupled to said diode, said first resistor and said capacitor, said second resistor being coupled between an inverting input of said second amplifier and said reference voltage source, said third resistor being coupled between and output of said second amplifier and said inverting input of said second amplifier, said second amplifier outputting said control signal.

8. An automatic gain control circuit according to claim 2, wherein:

said variable gain amplifier circuit comprises:

a resistor coupled to an inverting input of said amplifier and said detection element to receive said input signal from said detection element; and a reference voltage source coupled to a noninverting terminal of said amplifier; and wherein:

said variable impedance element comprises a transistor having a source coupled to said inverting input of said amplifier, a drain coupled to an output terminal of said amplifier and a gate coupled to said peak-holding circuit to receive said control signal from said peak-holding circuit; and said peak-holding circuit comprises:

a diode for receiving said output signal from said variable gain amplifier circuit;

a capacitor coupled between said diode and ground;

a second resistor coupled between said diode and ground;

a second reference voltage source; third and fourth resistors; and a second amplifier having a noninverting input coupled to said diode, said second resistor and said capacitor, said third resistor being coupled between an inverting input of said second amplifier and said second reference voltage source, said fourth resistor being coupled between an output of said second amplifier and said inverting input of said second amplifier, said second amplifier outputting said control signal.

9. An automatic gain control circuit according to claim 8, wherein said reset circuit comprises:

a transistor having an emitter grounded and a collector coupled to said capacitor in said peak-holding circuit;

a third reference voltage source;

a fifth resistor having a first terminal coupled to a base of said transistor; and a comparator having a noninverting input for receiving said control signal from said peak-holding circuit, an inverting input coupled to said third reference voltage source, and an output coupled to a second terminal of said fifth resistor.

10. An automatic gain control circuit according to claim 8, wherein said third reference voltage source is said reference voltage source in said variable gain amplifier circuit.

11. An automatic gain control circuit according to claim 8, wherein said reset circuit comprises:

a third reference voltage source; and an open collector output comparator having an inverting input coupled to said third reference voltage source, a noninverting input for receiving said control signal from said peak-holding circuit, and an open collector coupled to said capacitor in said peak-holding circuit.

12. An automatic gain control circuit according to claim 1, wherein said reset circuit comprises a synchronizing signal generating circuit for generating a synchronizing signal in response to the commencement of a scanning cycle of said detection element, and said peak-holding circuit is reset in response to said synchronizing signal.

13. An automatic gain control circuit according to claim 12, wherein said synchronizing signal generating circuit generates said synchronizing signal each time said scanning cycle of said detection element is commenced.

14. An automatic gain control circuit to claim 12, wherein:

said variable gain amplifier comprises:

a resistor coupled to an inverting input of said amplifier and said detection element to receive said input signal from said detection element; and a reference voltage source coupled to a noninverting terminal of said amplifier; and wherein:
said variable impedance element comprises a transistor having a source coupled to said inverting input of said amplifier, a drain coupled to an output terminal of said amplifier and a gate coupled to said peak-holding circuit to receive said control signal from said peak-holding circuit; and said peak-holding circuit comprises:
a diode for receiving said output signal from said variable gain amplifier circuit;
a capacitor coupled between said diode and ground;
a second resistor coupled between said diode and ground;
a second reference voltage source;
third and fourth resistors; and
a second amplifier having a noninverting input coupled to said diode, said second resistor and said capacitor, said third resistor being coupled between an inverting input of said second amplifier and said second reference voltage source, said fourth resistor being coupled between an output of said second amplifier and said inverting input of said second amplifier, said second amplifier outputting said control signal.

15. An automatic gain control circuit according to claim 14, wherein said reset circuit comprises:
a second transistor having an emitter grounded and a collector coupled to said capacitor in said peak-holding circuit; and
a fifth resistor having a first terminal coupled to a base of said second transistor;
said synchronizing signal generating circuit is coupled to a second terminal of said fifth resistor.

16. An automatic gain control circuit according to claim 15, wherein said synchronizing signal generating circuit comprises:
a third reference voltage source;
a detector circuit;
a third amplifier for receiving a detector signal from said detector circuit and providing an amplified detector signal; and
a comparator having an inverting input coupled to said third reference voltage source, a noninverting input for receiving said amplified detector signal from said amplifier and an output coupled to said second terminal of said fifth resistor.

17. An automatic gain control circuit according to claim 16, wherein said detector circuit comprises an optical detector.

18. An automatic gain control circuit according to claim 13, wherein:
said variable gain amplifier comprises:
a resistor coupled to an inverting input of said amplifier and said detection element to receive said input signal from said detection element; and
a reference voltage source coupled to a noninverting terminal of said amplifier; and
wherein:
said variable impedance element comprises a transistor having a source coupled to said inverting input of said amplifier, a drain coupled to an output terminal of said amplifier and a gate coupled to said peak-holding circuit to receive said control signal from said peak-holding circuit; and said peak-holding circuit comprises:
a diode for receiving said output signal from said variable gain amplifier circuit;
a capacitor coupled between said diode and ground;
a second resistor coupled between said diode and ground;
a second reference voltage source;
third and fourth resistors; and
a second amplifier having a noninverting input coupled to said diode, said second resistor and said capacitor, said third resistor being coupled between an inverting input of said second amplifier and said second reference voltage source, said fourth resistor being coupled between an output of said second amplifier and said inverting input of said second amplifier, said second amplifier outputting said control signal.

19. An automatic gain control circuit according to claim 18, wherein said reset circuit comprises:
a second transistor having an emitter grounded and a collector coupled to said capacitor in said peak-holding circuit; and
a fifth resistor having a first terminal coupled to a base of said second transistor;
said synchronizing signal generating circuit is coupled to a second terminal of said fifth resistor.

20. An automatic gain control circuit according to claim 19, wherein said synchronizing signal generating circuit comprises:
a third reference voltage source;
a detector circuit;
a third amplifier for receiving a detector signal from said detector circuit and providing an amplified detector signal; and
a comparator having an inverting input coupled to said third reference voltage source, a noninverting input for receiving said amplified detector signal from said amplifier and an output coupled to said second terminal of said fifth resistor.

21. An automatic gain control circuit according to claim 20, wherein said detector circuit comprises an optical detector.

* * * * *